US006839208B2

(12) United States Patent
Macbeth et al.

(10) Patent No.: US 6,839,208 B2
(45) Date of Patent: Jan. 4, 2005

(54) ARC FAULT CIRCUIT INTERRUPTER RECOGNIZING ARC NOISE BURST PATTERNS

(75) Inventors: Bruce F. Macbeth, Syracuse, NY (US); Thomas N. Packard, Syracuse, NY (US); Jeffrey C. Richards, Baldwinsville, NY (US); James P. Romano, Syracuse, NY (US)

(73) Assignee: Pass & Seymour, Inc, Syracuse, NY (US)

( * ) Notice: Subject to any disclaimer, the term of this patent is extended or adjusted under 35 U.S.C. 154(b) by 275 days.

(21) Appl. No.: 09/788,206

(22) Filed: Feb. 16, 2001

(65) Prior Publication Data

US 2001/0033469 A1 Oct. 25, 2001

Related U.S. Application Data

(60) Provisional application No. 60/183,287, filed on Feb. 17, 2000.

(51) Int. Cl.[7] ............................................. H02H 3/16
(52) U.S. Cl. ...................... 361/42; 324/520; 324/536; 702/79; 702/64; 361/45; 361/93.1
(58) Field of Search ............................. 361/42, 45, 94, 361/90, 93.1; 324/520, 528, 522, 76.11, 535, 536; 702/57, 58, 64, 65, 75, 79

(56) References Cited

U.S. PATENT DOCUMENTS

| | | | |
|---|---|---|---|
| 4,214,210 A | | 7/1980 | O'Shea |
| 5,208,542 A | | 5/1993 | Tennies et al. |
| 5,223,795 A | * | 6/1993 | Blades ........................ 324/536 |
| 5,432,455 A | | 7/1995 | Blades |
| 5,452,223 A | | 9/1995 | Zuercher et al. |
| 5,940,256 A | | 8/1999 | MacKenzie et al. |
| 5,946,179 A | | 8/1999 | Fleege et al. |
| 6,031,699 A | | 2/2000 | Dollar, II et al. |
| 6,246,556 B1 | | 6/2001 | Haun et al. |
| 6,377,427 B1 | | 4/2002 | Haun et al. |

* cited by examiner

Primary Examiner—Kim Huynh
(74) Attorney, Agent, or Firm—Daniel P. Malley; Bond, Schoeneck & King PLLC

(57) ABSTRACT

An arc fault circuit interrupter (AFCI) detects arc faults by identifying the various signature patterns of arc fault noise while rejecting arc mimicking noise from normal load phenomena.

56 Claims, 2 Drawing Sheets

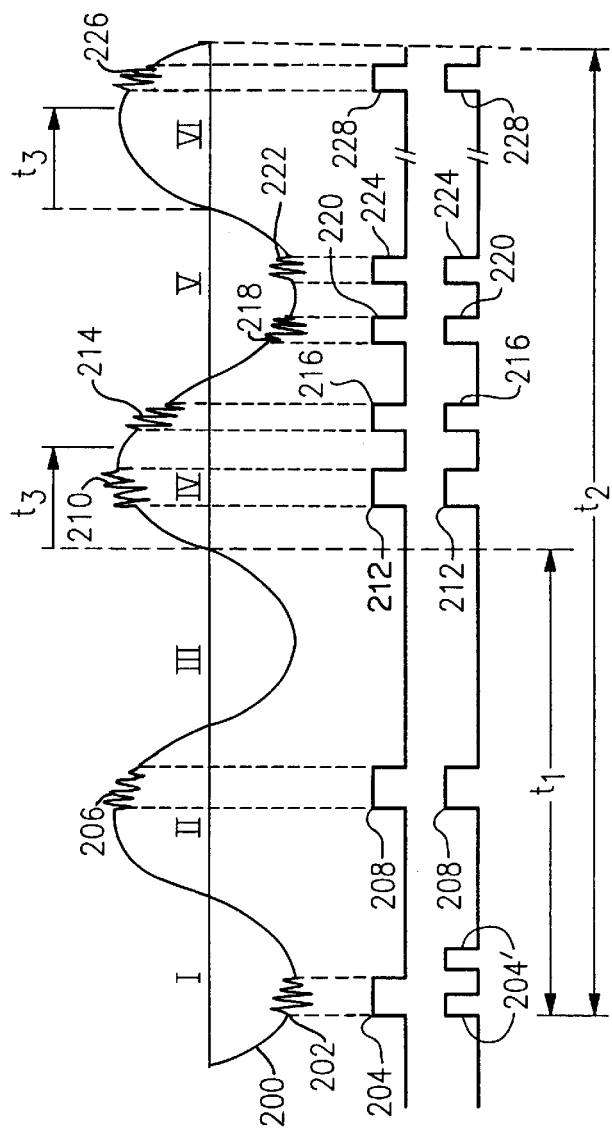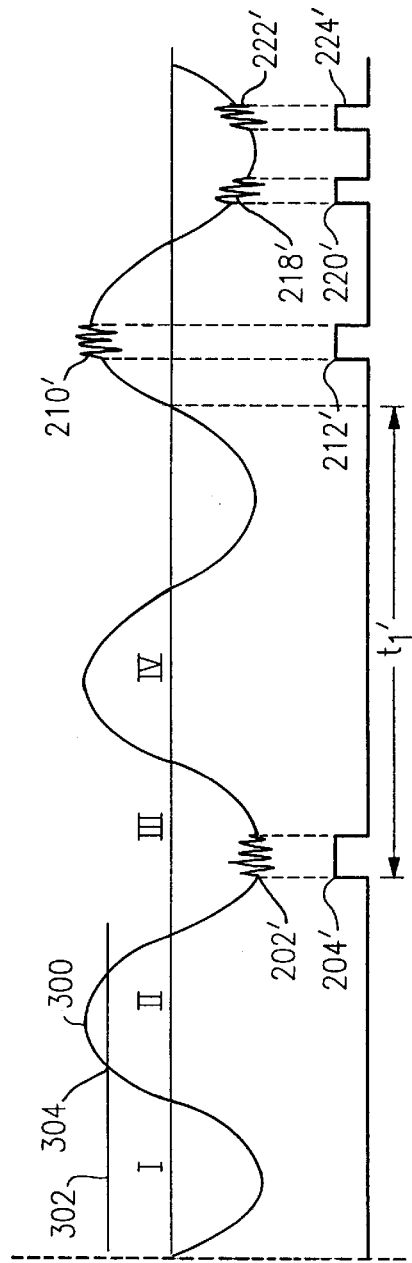

ARC FAULT CIRCUIT INTERRUPTER RECOGNIZING ARC NOISE BURST PATTERNS

CROSS-REFERENCE TO RELATED APPLICATIONS

This application claims priority from U.S. Provisional Application Ser. No. 60/183,287 filed Feb. 17, 2000 and entitled ARC FAULT CIRCUIT INTERRUPTER RECOGNIZING ARC NOISE BURST PATTERNS, incorporated herein by reference.

FIELD OF THE INVENTION

This invention relates generally to arc fault circuit interrupters, and more particularly to an arc fault circuit interrupter that uses the patterns of arc fault noise amplitudes above a predetermined level to detect the presence of arcing.

BACKGROUND OF THE INVENTION

A number of devices and methods have been used in the past to detect arc faults. Some of the prior art devices and techniques have involved the use of E and B field arc sensors, the detection of the amplitude of arc fault rate of change of current signals, the use of non-overlapping band-pass filters to detect white noise of arcs, and devices which detect the disappearance of arc faults near current zero crosses. Most of the prior art of arc detection occurs in circuit breakers where it acts as an enhancement to thermal-magnetic detection elements, which alone may fail to detect arc faults. To date, all of the circuit breaker arc fault detectors protect primarily building wiring up to the outlet but only offer limited protection for lamp and extension cords. This invention identifies particular patterns of arc fault noise sensed in the load current during arc faults which are particular to arc faults only. This invention also is intended for a receptacle embodiment which can protect downstream building wiring as well as the arcing that may occur in lamp cords or extension cords and also provide limited protection of upstream building wiring.

There is a need for an economical arc fault detector which may be mounted into a wiring device which offers the same down stream protection as an arc fault detecting circuit breaker but at the similar cost advantage that currently exist between ground fault interrupting receptacles and ground fault interrupting circuit breakers. A receptacle arc fault detector has the additional advantage of being universally adaptable to any wiring system, which is in contrast to circuit breaker arc fault detectors which are specific to a particular panel box manufacturer. This invention provides that cost and universal mounting advantage.

SUMMARY OF THE INVENTION

Briefly stated, an arc fault circuit interrupter (AFCI) detects arc faults by identifying the various signature patterns of arc fault noise while rejecting arc mimicking noise from normal load phenomena.

When arc faults occur, typically an arc step in current is followed by broad band arc noise caused by the random fluctuations in arc column resistance. In this invention, a logic signal is created which has a width that corresponds to the interval during which the magnitude of the broad band arc noise generated by both the start of the arc and the duration of the arc is above a predetermined level. Typically an arc fault randomly starts, generates a di/dt step in current followed by granular di/dt variations of the broad band arc noise, and then extinguishes at the approach of the next current zero cross. The magnitude and frequency spectrum of the arc noise will be influenced by whether the arc fault is in series or parallel with the load, the type of material involved in the arc, and the magnitude of the arc current. If the load is inductive, the inductance may act as a filter element to the arc step and broadband arc noise, tending to stabilize the arc and limit the bandwidth and amplitude of the arc noise. Arcs that shower tend to have a different arc noise amplitude and spectra from those that sputter. Arc faults tend to produce weak and strong periods of arc noise during the arc. Some series arc faults may wander from arcs to glowing resistive connections and back again to arcing, producing pulses of arc noise during an arcing half wave. Although glowing connections cannot be detected by this invention, glowing connections tend to change to series arcing when vibrated, as when a door closes near, and vibrates, an outlet with a loose terminal screw undergoing a glowing connection. Field testing of this invention has exposed this kind of problem, where intermittent series arcing of a loose terminal undergoing a glowing connection caused a device incorporating this invention to trip and interrupt the circuit with the glowing connection, which when investigated for the cause, exposed years of insulation damage from the glowing connection.

According to an embodiment of the invention, an arc fault detector for protecting electric power lines includes a sensor coupled to the power lines for detecting broad band arc noise; a di/dt detector connected to the sensor for generating an output pulse having a time width associated with a time during which a pulse of broad band arc noise is above a predetermined threshold; a processor connected to the detector; a power line zero cross detector generating a pulse; wherein the processor evaluates a width of the di/dt detector output pulse during each half wave following a zero cross pulse and opens a detection window for a first predetermined number of power line half cycles if, during any one power line half cycle, either (a) the width of the output pulse is equal to or exceeds a first predetermined interval, or (b) the width of the output pulse is equal to or exceeds two or more second predetermined intervals; wherein a length of the second predetermined interval is less than a length of the first predetermined interval; and wherein during the open detection window the processor ignores the output pulses for a rejection period lasting a second predetermined number of half cycles at a start of the window.

According to an embodiment of the invention, a method for detecting and interrupting arc faults in electric power lines includes the steps of sensing random high frequency components in a load current of the electric power lines; producing pulse signals whose widths correspond to durations of the high frequency components; opening a window upon detection of a first pattern of the pulse signals; ignoring the pulse signals after the window is opened for a predetermined interval; and interrupting load power in the electric power lines when one of the first pattern of pulse signals and a second pattern of pulse signals occurs after the step of ignoring while the window remains open.

According to an embodiment of the invention, a method for detecting and interrupting arc faults in electric power lines includes the steps of sensing line frequency components and random high frequency components in a load current of the electric power lines; producing pulse signals whose widths correspond to durations of the high frequency components; and disabling detection of the pulse signals if a magnitude of the line frequency component is below a threshold current.

According to an embodiment of the invention, a method for detecting and interrupting arc faults in electric power lines includes the steps of sensing random high frequency components in the load current of the electric power lines; producing pulse signals whose widths correspond to durations of the high frequency components; opening a window upon detection of one or more first patterns of pulse signals; ignoring the pulse signals after the window is opened for a first predetermined interval; and ignoring the pulse signals while the window is open if there is a presence of pulse signals for a second predetermined interval.

According to an embodiment of the invention, a method for detecting and interrupting arc faults in electric power lines includes the steps of sensing random high frequency components in a load current of the electric power lines; producing pulse signals whose widths correspond to durations of the high frequency components; and preventing tripping of a circuit interrupter if the pulse signals continue without interruption for a predetermined interval.

According to an embodiment of the invention, a method for detecting and interrupting arc faults in electric power lines includes the steps of sensing high frequency components in a load current of the electric power lines; and amplifying the high frequency component using a voltage doubler circuit.

According to an embodiment of the invention, a method for detecting and interrupting arc faults in electric power lines includes the steps of sensing line frequency components and random high frequency components in a load current of the electric power lines; producing pulse signals whose widths correspond to durations of the high frequency components; and producing a trip signal if one of the line frequency components is above a threshold irrespective of the high frequency components.

According to an embodiment of the invention, a method for detecting and interrupting arc faults in electric power lines includes the steps of sensing line frequency components and random high frequency components in a load current of the electric power lines; producing pulse signals whose widths correspond to durations of the high frequency components; opening a window upon detection of at least one predetermined first pattern of pulse signals; comparing a magnitude of a power line frequency against a threshold; tripping a circuit interrupter on the electric power lines if a second pattern of pulse signals occurs when the window is open and the power line frequency is below the threshold; and tripping the circuit interrupter if a third pattern of pulse signals occur when the window is open and the power line frequency is above the threshold.

According to an embodiment of the invention, an apparatus for detecting and interrupting arc faults in electric power lines includes means for sensing random high frequency components in a load current of the electric power lines; means for producing pulse signals whose widths correspond to durations of the high frequency components; means for opening a window upon detection of a first pattern of the pulse signals; means for ignoring the pulse signals after the window is opened for a predetermined interval; and means for interrupting load power in the electric power lines when one of the first pattern of pulse signals and a second pattern of pulse signals occurs after the step of ignoring while the window remains open.

According to an embodiment of the invention, an apparatus for detecting and interrupting arc faults in electric power lines includes means for sensing line frequency components and random high frequency components in a load current of the electric power lines; means for producing pulse signals whose widths correspond to durations of the high frequency components; and means for disabling detection of the pulse signals if a magnitude of the line frequency component is below a threshold current.

According to an embodiment of the invention, an apparatus for detecting and interrupting arc faults in electric power lines includes means for sensing random high frequency components in the load current of the electric power lines; means for producing pulse signals whose widths correspond to durations of the high frequency components; means for opening a window upon detection of one or more first patterns of pulse signals; and means for ignoring the pulse signals after the window is opened for a first predetermined interval and for ignoring the pulse signals while the window is open if there is a presence of pulse signals for a second predetermined interval.

According to an embodiment of the invention, an apparatus for detecting and interrupting arc faults in electric power lines includes means for sensing random high frequency components in a load current of the electric power lines; means for producing pulse signals whose widths correspond to durations of the high frequency components; and means for preventing tripping of a circuit interrupter if the pulse signals continue without interruption for a predetermined interval.

According to an embodiment of the invention, an apparatus for detecting and interrupting arc faults in electric power lines includes means for sensing high frequency components in a load current of the electric power lines; and means for amplifying the high frequency component using a voltage doubler circuit.

According to an embodiment of the invention, an apparatus for detecting and interrupting arc faults in electric power lines includes means for sensing line frequency components and random high frequency components in a load current of the electric power lines; means for producing pulse signals whose widths correspond to durations of the high frequency components; and means for producing a trip signal if one of the line frequency components is above a threshold irrespective of the high frequency components.

According to an embodiment of the invention, an apparatus for detecting and interrupting arc faults in electric power lines includes means for sensing line frequency components and random high frequency components in a load current of the electric power lines; means for producing pulse signals whose widths correspond to durations of the high frequency components; means for opening a window upon detection of at least one predetermined first pattern of pulse signals; means for comparing a magnitude of a power line frequency against a threshold; means for tripping a circuit interrupter on the electric power lines if a second pattern of pulse signals occurs when the window is open and the power line frequency is below the threshold; and means for tripping the circuit interrupter if a third pattern of pulse signals occur when the window is open and the power line frequency is above the threshold.

BRIEF DESCRIPTION OF THE DRAWINGS

FIG. 2A shows a waveform of a load current with arcing present.

FIG. 2B shows a waveform of a signal produced by the circuit of FIG. 1 in the presence of arcing.

FIG. 2C shows a waveform of an alternate signal produced by the circuit of FIG. 1 in the presence of arcing.

FIG. 3A shows a waveform used in describing an alternate embodiment of the invention.

FIG. 3B shows a waveform used in describing an alternate embodiment of the invention.

DETAILED DESCRIPTION OF THE PREFERRED EMBODIMENT

Figure 1:
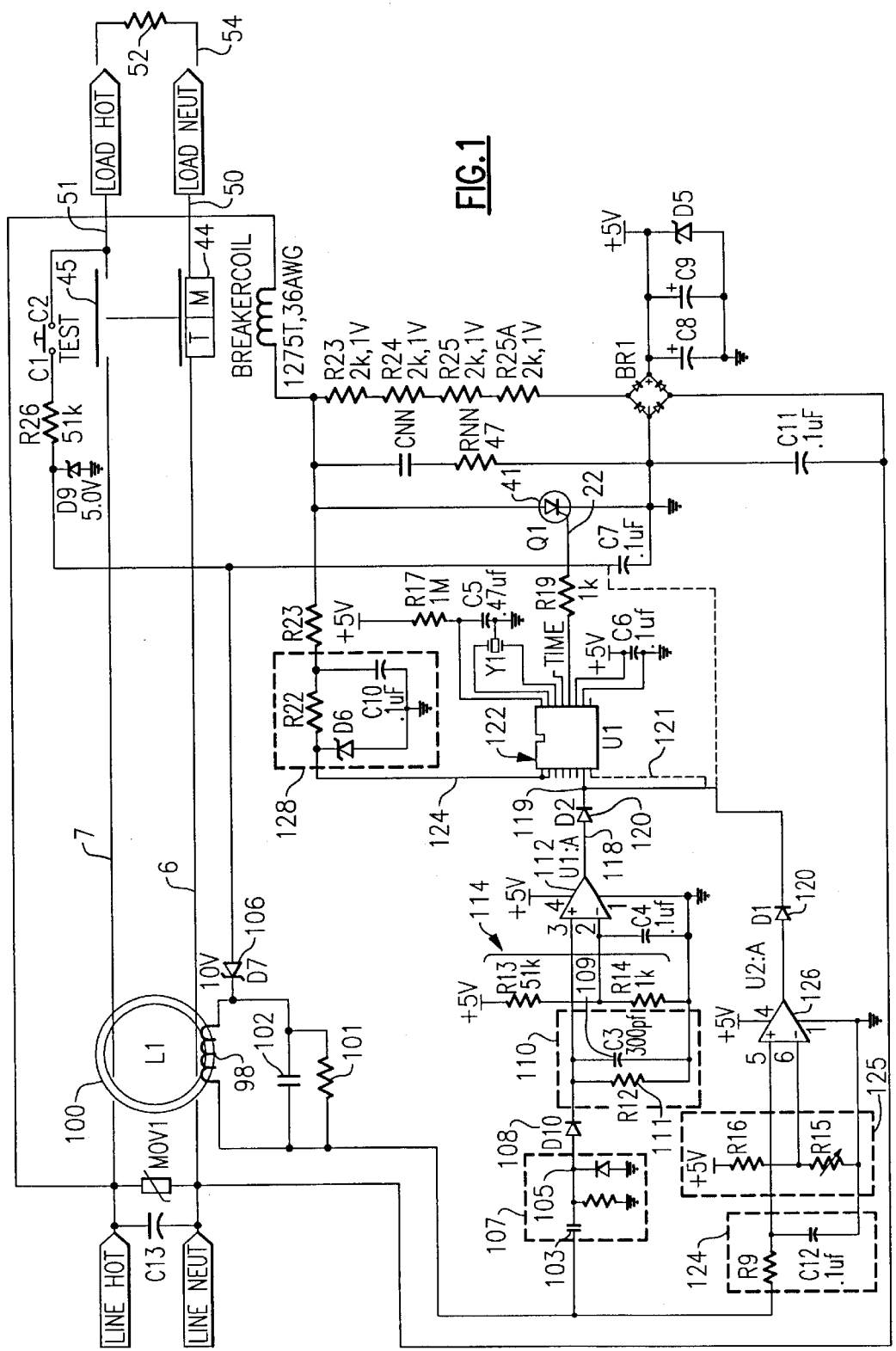
FIG. 1 shows a schematic diagram of a circuit according to an embodiment of the invention.

Referring now to FIG. 1, an arc fault circuit interrupter of the present invention is illustrated in schematic form. The arc fault circuit interrupter shown in FIG. 1, as well as the arc fault circuit interrupter shown in the remaining figures, is formed from small inexpensive components that can be easily integrated into an electrical receptacle, plug, or in-line device. The circuit is designed so that it can be manufactured in the same form as the ground fault circuit interrupter devices shown in U.S. Pat. Nos. 5,594,358 and 5,510,760, for example. The arc fault circuit interrupter of FIG. 1 protects an electrical circuit including at least a neutral conductor 6 and a line conductor 7. A ground may also be present and the arc fault circuit interrupter of FIG. 1 will detect arcs occurring between the line conductor and ground, the neutral conductor and ground, or the line and neutral conductors.

A circuit interrupter 45 is connected in series with the line, between the power source and a load 52. A contactor or similar device may be employed, which includes a first set of contacts connected to the neutral conductor 6 and to load 52 by way of a conductor 50, and a second set of contacts connected to the line conductor 7, and to load 52 by a conductor 51. Preferably, the first and second contacts are spring loaded by a mouse trap type arrangement, controlled by a trip mechanism 44. When trip mechanism 44 is activated, the spring loaded contacts open and latch in an open condition until they are manually reset. A device of this type is well known, and is shown, for example, in U.S. Pat. No. 5,510,760.

In particular, this embodiment incorporates a broadband current sensor 100, which is a toroidal transformer with the hot 7 and neutral 6 wires forming one turn primaries, and which has an asymmetrical winding 98 which senses more of the magnetic flux produced by one of the primary wires than the other in response to an arc fault. Winding 98 may also have a capacitor 102 and a resistor 101 connected in parallel to form a resonant circuit responding to a predetermined bandwidth of arc fault noise. Resistor 101 is used to lower the Q of the circuit and increase the response bandwidth.

The signal produced by the asymmetrical winding is amplified and divided into two paths. The first path is filtered by a high pass filter 107 to remove the 60 Hz fundamental frequency and power line harmonics. The resulting signal is then rectified by a diode 108 and applied to an integrator 110 which includes a discharge resistor 111. The signal is applied as input to a comparator 112 whose output goes HIGH if the input signal exceeds a predetermined threshold established by a voltage divider 114. The second signal path is filtered by a low pass filter 124, with a break frequency of approximately 60 Hz, stripping off any high frequency signal components. The signal is then applied as input to a comparator 126, whose output goes HIGH if the input signal exceeds a predetermined threshold established by a voltage divider 125.

In one mode, comparator 126 acts as a shorted fault current trigger, and causes circuit interrupter 45 to interrupt the current to load 52 at a predetermined level of 60 Hz current, regardless of arcing, which is intended to protect the AFCI from the effects of prolonged overcurrent. The predetermined level of 60 Hz current is typically 500 amperes. The output of comparator 126 drives a gate 22 of an SCR 41 directly. Alternatively, mode one can be accomplished by a Zener diode 106 which passes high level signals from asymmetrical winding 98 whose magnitude exceeds the Zener barrier directly to gate 22.

In mode two, the signal from comparator 126 and the signal from comparator 112 are inputs to a functional OR gate formed by diodes 120, which are connected to node 119 of microprocessor 122. Those of ordinary skill in the art will recognize that when comparator 112 and/or comparator 126 are driven HIGH, the input (node 119) to microprocessor 1222 will also be HIGH. If both comparator outputs are LOW, node 119 will likewise be LOW. The purpose of using the comparator 126 to affect the signal at the input node 119 of microprocessor 122 is to allow software filtering of inrush events such as motor start up currents, and also to allow speedier arc fault interruption of arc faults with large 60 Hz components.

In mode three, the signal from comparator 126 is connected to a dedicated input 121 of microprocessor 122, which allows microprocessor 122 to simultaneously analyze both di/dt and 60 Hz signals for signatures indicative of arcing, i.e., constant 60 hz components above the circuit rating causing switching of comparator 126 output, which comparator 126 output is applied as one microprocessor input, accompanied by di/dt events from comparator 112 output as the other microprocessor input 119. This arrangement allows detection of 60 Hz sinusoidal components of load current which are above the circuit rating allowing microprocessor 122 to trigger into a software mode when microprocessor 122 analyses the di/dt information arriving from comparator 112 in a mode which lowers the pulse width requirements in both the DATA DETECTION WINDOW and the ARC DETECTION software requirements allowing a brief and speedy circuit interrupter action. This speedy action is much faster than the microprocessor analysis speed in response to load currents during quiescent operation, where the load currents are below the circuit rating and may contain normal arc mimicking signals which must be processed more rigorously to avoid false tripping.

Alternatively, voltage divider 125 can be set to a threshold corresponding to a 5 amp current through load 52, which is a current threshold set for A-type or series arc faults, below which the arc fault is not considered to be hazardous, and below which it is desirable for circuit interrupter 45 not to operate. Comparator 126 has a low output corresponding to load currents below 5 amps. A low state at input 121 inhibits microprocessor 122 from producing a signal that would ultimately cause circuit interrupter 45 to operate. This feature is termed MINIMUM CURRENT REJECT.

In the first path, the integrated bandwidth selected arc noise is applied to an integrator 110 which acts to store the charge from a series of brief arc noise pulses, raising the voltage across the integrator output to a level which switches comparator 112. Comparator 112 produces an output pulse varying in width proportional to the time the integrated arc step and arc duration noise is above a predetermined limit set by a comparator 112 reference set by voltage divider 114. Diode 108 prevents integrator capacitor 109 from discharging back through the sensor, with the discharge set solely by resistor 111. This allows capacitor 109 to pump charge on the arc pulses. Diode 108 could be replaced by a bridge rectifier allowing for faster charging of the integrator capacitor 109 by rectifying both positive and minus arc information, although the same effect can be produced with one diode and using a lower value of integrator capacitor 109. Di/dt changes in the line current cause sensor 100 to ring, producing positive and negative transitions, and therefore a positive di/dt event in the sensed current will also produce positive and minus signals in the sensor output during the ring, although the second ring is of approx. 30% lesser magnitude. An optional diode 105 causes capacitor 103 to act as a voltage doubler capacitor, charging on the negative going di/dt pulses from the sensor, with the negative di/dt charge pumped along with positive di/dt pulses into capacitor 109 raising the voltage beyond that attainable with a single diode 108. This allows less dependence on ringing, allowing a lower turn count requirement on the sensor 100 for a given voltage output, and thus permitting a smaller sized sensor. The brief arc noise di/dt pulses must continue or the charge across the integrator 110 capacitor 109 is quickly removed by the integrator discharge resistor 111, causing comparator 112 to switch off. The output of comparator 112 is applied as data input 119 to microprocessor 122 which uses zero cross detector 124 (or a current zero cross) as a time reference.

The microprocessor 122 performs arc discriminating functions, each function acting as a firewall against arc mimicking noise with each successive function acting as a higher hurdle to the incoming signal. The first function is opening a DATA DETECTION WINDOW if the width of the comparator 126 output is greater than or equal to a first predetermined interval indicating a sustained interval of arcing above the predetermined limit during a half wave, or alternately microprocessor 122 opens a data detection window if the comparator 112 output has two or more shorter width pulses greater than or equal to a second predetermined interval, indicating bursts of arcing noise above the predetermined limit during a half wave. The second function, once the window is open, is ignoring the comparator 112 output for a first predetermined number of half cycles in a REJECT INITIAL HALF CYCLES mode, which acts to hold off the microprocessor 122 arc detection software routine from responding to arc mimicking transient noise associated with switch activation and the like.

After the ignored number of half cycles, microprocessor 122 analyzes comparator 112 output signal for arc fault patterns in a third function, ARC DETECTION mode, for a second predetermined number of half cycles, after which microprocessor 122 returns to the wait state to open the DATA DETECTION WINDOW.

During the open DATA DETECTION WINDOW, and after the initial ignored half cycles at the start of the window, microprocessor 122 expands on the window opening signature events, in which the signature events must pass over a higher hurdle than for the window opening. The first hurdle is detection of continuous comparator 112 output width for a third predetermined interval, during each half wave, indicates a continuous arc of a longer duration that the first predetermined interval for opening a window. The second hurdle is a series of comparator 112 output widths, of a fourth predetermined interval, which are smaller than the third predetermined interval, all occurring in a half wave, indicating continued bursts of arc noise.

Arc faults at times produce a strong di/dt step in current at the start of the arc followed by weaker arc column di/dt fluctuations during the arc. At other times a rapidly sputtering arc will produce more di/dt during the arc than at the start of the arc. Series arc faults, involving an inductive load, will typically have weak di/dt at the start of the arc, where the di/dt may be indistinguishable from the di/dt during the arc. Integrator capacitor 109 will charge to the same approximate voltage for a large single di/dt event as the charge occurring from a long string of di/dt events during the arc. This allows for similar comparator 112 output for arc faults with strong arc start di/dt pulses, but weak di/dt pulses during the arc, as compared to arc faults which have the inverse.

The DATA DETECTION WINDOW, REJECT INITIAL HALF CYCLES, and ARC DETECTION software algorithms act as three primary firewalls, in addition to the filtering effect of sensor 100 and filters 107 and 110, against false detection of arc fault mimicking events. MINIMUM CURRENT REJECT as previously described optionally is a fourth firewall. Events that pass through the firewalls result in microprocessor 122 issuing a turn-on signal to gate 22 of SCR 41, activating trip mechanism 44 and circuit interrupter 45, and disconnecting the power source from the load 52. Arc fault mimicking events do not pass through the firewalls. Examples are as follows: the initial and continuous conduction di/dt pulses of phase control switches, such as light dimmers, di/dt transients caused by switch closures, switch opening arcs, motor brush noise, power line carriers, and switching noise from inverters and chopper power supplies.

The di/dt pulses from dimmers begin as large pulses during the heat up of the tungsten filament load, and continue as small di/dt pulses during continuous dimmer operation of the load. Sensor 100 produces signals from these pulses which are subsequently integrated by integrator 110. The amount of voltage rise across the integrator capacitor 109, and the width of the comparator 112 output pulse for the single di/dt event which occurs every half cycle from a triac controlled dimmer, depend on the load size and whether the dimmer has an RFI inductor. A 1 KW dimmer controlling a 1 KW tungsten bulb, without an RFI inductor, will produce a current inrush step near 75 A, which is in the range of parallel arc fault steps. The DATA DETECTION WINDOW firewall is set to open on a di/dt event such as this, so as not to exclude arc fault steps, but the REJECT INITIAL HALF CYCLES firewall software causes rejection of this data for a period long enough for the di/dt pulse to drop with the rising resistance of the tungsten filament to a pulse width which is ignored by the ARC DETECTION firewall algorithm following the REJECT INITIAL HALF CYCLES firewall period.

Once the window closes, the pulse width of the steady state dimmer di/dt is too small to open the detection window, and the AFCI returns to the state of triple firewall software resistance to the operating dimmer. A dimmer does not produce more than one di/dt pulse per half wave and does not produce accompanying arc noise. Arc noise, which can produce more than one pulse per a half wave, in addition to the first window opening criterion, can open the DATA DETECTION WINDOW using the alternate opening function, i.e., more than one pulse per half wave. This allows for speedy window opening while rejecting phase control dimmers.

Arc mimicking noise from switch closure transients typically produce di/dt pulse widths which do not satisfy the first condition for OPEN DETECTION WINDOW, or the second condition of more than one pulse per half cycle to satisfy the second condition for OPEN DETECTION WINDOW. Switch bounce, which may produce two or more pulses, typically produces the bouncing within a close enough period which is integrated by the integrator 110 into one pulse, which will not open a detection window. If a switch closure event does manage to open a detection window, the event never lasts more than one line cycle and is rejected by the REJECT INITIAL HALF CYCLES firewall software.

When a switch opens, the opening switch arc can last for a long enough period to satisfy the open window conditions, but the arc lasts only one half cycle, and is rejected by the REJECT INITIAL HALF CYCLES firewall software. Broadband noise produced by brush motors either occurs at an amplitude below arc fault noise or has a different spectra from arc noise which does not produce enough di/dt signal to open a detection window.

Some loads, such as switching power supplies and compact fluorescent lights, produce converter noise which can mimic arc fault noise, but these loads tend to produce the noise in a predictable interval of the sine wave subject to discrimination or at frequencies rejected by sensor 100 and filter 107. Power line carriers are also rejected by filter 107.

Although the circuit of FIG. 1 does not show amplification of the arc signal from sensor 100, amplification can be included which allows for less sensor turns, or a smaller sensor, or more gain to overcome additional filtering signal losses.

During an arc fault, a large di/dt arc step pulse will open a detection window if the pulse is big enough to cause a comparator 112 pulse width greater than or equal to the first predetermined value, or alternately, if the lower di/dt arc noise during the arc pumps up capacitor 109 holding the comparator output high long enough to satisfy the open window requirement. The other way for opening the window is when two or more di/dt pulses occur in a half cycle, thereby causing two comparator 112 output pulses which satisfy the second window opening criterion. An arc fault can produce double di/dt pulsing during a half wave whereas a dimmer cannot, as only one pulse happens per half cycle.

When a more stable B-type (or parallel) arc fault starts, typically a large di/dt pulse occurs during the first half wave near the voltage peak, but subsequent arc steps occur nearer the zero cross at the start of the half wave and have steps that are more similar to operating 1 KW dimmers without RFI. Arcs of this type produce signals which may not satisfy the first open detection window requirement but rely on the second and must have di/dt of sufficient amplitude during the arc for detection. These arcs will have a large 60 hz component, triggering the alternate speedy software, which reduces the pulse widths required for opening a window and the pulse width requirement during the arc detection mode, thereby allowing for fast detection.

Sputtering arcs tend to have start steps of the arc sequence nearer the peak of the voltage wave than parallel arc faults, which can easily satisfy the OPEN DETECTION WINDOW on the first requirement, and also satisfy the ARC DETECTION algorithm without, or with very little, di/dt information during the arc. Sputtering arcs tend to have lots of lower frequency arc noise during the arc which may not produce as much di/dt during the arc. Once a di/dt event satisfies the OPEN DETECTION WINDOW requirement, and through the REJECT INITIAL HALF CYCLES period, any di/dt which can keep the comparator output high for approximately 1 ms has a very high probability of being an arc fault event.

FIG. 2A is a waveform of the load current under the presence of arcing as has been described. Superimposed on the power line frequency, typically 60 Hz, are randomly occurring, high frequency noise bursts 202, 206, 210, 214, 218 and 222. FIG. 2B shows corresponding impulse signals 204, 208, 212, 216, 220, 224 from comparator 112, for the embodiment in which the comparator 126 output is connected to SCR gate 22. If a noise pulse 204 from comparator 112 to microprocessor input 119 exceeds a first predetermined duration, such as 0.5 milliseconds as shown as pulse 204 in FIG. 2B, a DATA DETECTION WINDOW t2 is opened, typically set to about 250 milliseconds or thirty half cycles of the power line frequency. The REJECT INITIAL HALF CYCLES interval t1 is also initiated, whose duration is about 16 milliseconds or two line cycles of the power line frequency. Noise burst 206 and corresponding noise pulse 208 occur during the interval t1 and are therefore ignored by the ARC DETECTION software in microprocessor 122 regardless of the duration of the duration of pulse 208.

Noise bursts occurring after t1 but before the DATA DETECTION WINDOW t2 closes and having sufficient duration or distribution cause the ARC DETECTION software in microprocessor 122 to turn on SCR 41, activating trip mechanism 44 to open circuit interrupter 45. Examples are a single pulse having a duration greater than about 1 millisecond as in pulse 212, or two pulses occurring within a half cycle of the power line frequency each having a duration greater than about 0.25 milliseconds, shown as pulses 220 and 224. Pulses greater than 0.25 milliseconds but not occurring in the same half cycle are ignored by the ARC DETECTION software. For example if pulses 214 and 224 were sole pulses, each below about 1 millisecond, they would be ignored.

FIG. 2C is the same as FIG. 2B, except that two pulses 204' occurring within a half cycle of the power line frequency each exceeding 0.25 milliseconds in duration may also enable the DATA DETECTION WINDOW and the REJECT INITIAL HALF CYCLES interval. The remaining pulses in FIG. 2C are as described for FIG. 2B.

Comparator 126 and comparator 112 signals can be combined at microprocessor input 119 as previously described, such that pulse durations are increased when a high level of line frequency current is sensed by broadband current sensor 100, thereby increasing the likelihood of exceeding the pre-determined durations that enable the ARC DETECTION software in microprocessor 122 to turn on SCR 41 and ultimately to operate the circuit interrupter 45, shortening the trip time of the AFCI when there are high arc fault currents, and in particular, those associated with B-type or parallel arc faults.

FIG. 3A represents the alternate embodiment that was previously described, in which comparator 126 is connected to input 121 of microprocessor 122. A voltage proportional to the load current and filtered by low pass filter 124 is shown as a curve 300, essentially the power line frequency, which is compared by comparator 126 to a DC reference voltage shown as a curve 302. If the voltage from low pass filter 124 exceeds the reference voltage as occurs at 304, a condition representing high B-type or parallel arc faults, a set of shorter pre-determined durations are enabled to likewise shorten the trip time of the AFCI when there are abnormally high currents, in particular those associated with B-type or parallel arc faults. While the time constants are different, the primed references in FIG. 3A and FIG. 3B have the same functions as like references in FIG. 2.

An alternate aspect is shown in FIG. 2A by a delay period t3, typically 5 milliseconds in duration, commencing with each zero crossing of each half cycle over the interval between t1 and t2, that is, after t1 ends and before t2 ends. Arc-mimicking noise caused by solid state dimmers is more likely to reside in delay periods t3 than in other periods. ARC DETECTION software is preferably designed to either ignore or apply a set of pre-determined pulse duration requirements to noise bursts that reside in this interval. In this manner, the noise burst 210 that previously caused the AFCI to trip may not cause the AFCI to trip. Noise burst 226 residing after the interval t3 would be treated as before. Delay periods t3 establish a fifth firewall termed PHASE ANGLE DETECT that discriminates between arc-related noise bursts and arc mimicking noise.

In yet another embodiment, a sixth firewall may be established, referred to herein as QUIET INTERVAL DETECT. After interval t1 elapses, ARC DETECTION software can be designed to be inhibited until such time as there is an absence of noise bursts and corresponding pulses for a half cycle. Once the QUIET INTERVAL DETECT firewall is passed, the given patterns of subsequent pulses can enable the ARC DETECTION software to ultimately operate circuit interrupter 45. As previously described, examples of such combinations are a single pulse having a duration greater than about 1 millisecond as shown as pulse 212, or two pulses occurring within a half cycle of the power line frequency each having a duration greater than about 0.25 milliseconds, shown as pulses 220 and 224.

Yet a seventh example of a firewall is the occurrence of continuous high frequency noise sources, producing the same amplitudes of di/dt signal as occur during an arcing fault, but without characteristic arcing fault noise bursts. Upon detection of noise lasting a substantial portion of one or more arcing half cycles after t1 has elapsed, ARC DETECTION software is prevented from operating the circuit interrupter 45, either by preventing the opening of a window, or preventing the recognition of pulses once the window is opened. The seventh firewall is termed CONTINUOUS NOISE REJECT.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. An arc fault detector for protecting electric power lines, comprising:
    a sensor coupled to said power lines for detecting broad band arc noise;
    a di/dt detector connected to said sensor for generating an output pulse having a time width associated with a time during which a pulse of broad band arc noise is above a predetermined threshold;
    a processor connected to said detector;
    a power line zero cross detector generating a time reference pulse for said processor;
    wherein said processor evaluates a width of said di/dt detector output pulse during each half wave following a zero cross pulse and opens a detection window for a first predetermined number of power line half cycles if, during any one power line half cycle, either (a) said width of said output pulse is equal to or exceeds a first predetermined interval, or (b) said width of said output pulse is equal to or exceeds two or more second predetermined intervals;
    wherein a length of said second predetermined interval is less than a length of said first predetermined interval; and
    wherein during said open detection window said processor ignores said output pulses for a rejection period lasting a second predetermined number of half cycles at a start of said window.

2. An arc fault detector according to claim 1, further comprising means for discriminating between arc fault signals and arc mimicking signals that occur after said rejection period but during said open detection window.

3. An arc fault detector according to claim 2, wherein said means for discriminating includes at least one firewall selected from the group consisting of MINIMUM CURRENT REJECT, PHASE ANGLE REJECT, QUIET INTERVAL DETECT, and CONTINUOUS NOISE REJECT.

4. An arc fault detector according to claim 1, wherein said detection window is opened only if a load current is equal to or exceeds 5 amperes.

5. An arc fault detector according to claim 1, further comprising a selector switch which acts to select a sensitivity of said detector to a magnitude of arc faults.

6. An arc fault detector according to claim 1, wherein said detection window is opened only if said half wave is not substantially filled with arc noise.

7. An arc fault detector according to claim 1, wherein said processor ignores all half waves which are substantially filled with arc noise.

8. An arc fault detector according to claim 1, further comprising:
    a low pass filter connected to said sensor having a break frequency equivalent to a fundamental frequency of said power lines;
    a level detector connected to said low pass filter, in which activation of said level detector at a predetermined magnitude of a frequency of a line current in said power lines causes said processor to evaluate said di/dt detector output pulse during each half wave following a zero cross pulse and to open a detection window for a first predetermined number of power line half cycles if during any one power line half cycle the width of the output pulse is equal to or exceeds a third predetermined interval, and during which open detection window said processor ignores said output pulses for a rejection period lasting said second predetermined number of half cycles at said start of the window; and
    wherein said processor produces an arc detection signal if, at any time after said rejection period, said detector output pulse width exceeds a fourth predetermined interval, said fourth predetermined interval being greater than said third predetermined interval.

9. An arc fault detector according to claim 1, further comprising interrupting means for interrupting current through said power lines downstream of said sensor, wherein said interrupting means includes:
    an SCR as a trip switch; and
    a Zener diode directly coupling said sensor output to a gate of said SCR, wherein a breakover voltage of said Zener diode is selected at a predetermined level such that said sensor output directly triggers said SCR during large fault currents.

10. An arc fault detector according to claim 1, further comprising:
    a high current override, wherein said sensor is coupled to an amplifier through a high pass filter which rejects a signal from said sensor due to the frequency of a line current in said power lines; and
    said high current override including a bypass element which allows said signal to bypass said high pass filter, wherein a predetermined level of a load current results in said detector generating a pulse which is detected by said processor as an arc fault.

11. A method for detecting and interrupting arc faults in electric power lines, comprising the steps of:
sensing random high frequency components in a load current of said electric power lines;
producing pulse signals whose widths correspond to durations of said high frequency components;
opening a window upon detection of a first pattern of said pulse signals;
ignoring said pulse signals after said window is opened for a first predetermined interval; and
interrupting load power in said electric power lines when one of said first pattern of pulse signals and a second pattern of pulse signals occurs after said step of ignoring while said window remains open.

12. A method according to claim 11, further comprising the step of determining a phase angle of each trailing portion initiation of an arc fault using a zero cross detector.

13. A method according to claim 11, further comprising the step of determining patterns of pulse signals with respect to half cycles of the power line frequency.

14. A method according to claim 13, further comprising the step of using a zero cross detector to determine the position of said half cycles.

15. A method according to claim 11, further comprising the step of ignoring said pulse signals while said window is open if there is a presence of pulse signals for a second predetermined interval.

16. A method according to claim 15, wherein said second predetermined interval is a half cycle of the power line frequency.

17. A method according to claim 11, further comprising the step of preventing tripping of a circuit interrupter if said pulse signals continue without interruption for a second predetermined interval.

18. A method according to claim 17, wherein said second predetermined interval is one half cycle of the power line frequency.

19. A method according to claim 11, further comprising the step of producing a trip signal if a line frequency component is above a threshold irrespective of said high frequency components.

20. A method according to claim 19, wherein said threshold is 500 amperes.

21. A method according to claim 11, further comprising the step of amplifying said high frequency component using a voltage doubler circuit, said step of amplifying occurring after the step of sensing and before the step of producing.

22. A method for detecting and interrupting arc faults in electric power lines, comprising the steps of:
sensing line frequency components and random high frequency components in a load current of said electric power lines;
producing pulse signals whose widths correspond to durations of said high frequency components;
opening a window upon detection of at least one predetermined first pattern of pulse signals;
comparing a magnitude of a power line frequency against a threshold;
tripping a circuit interrupter on said electric power lines if a second pattern of pulse signals occurs when said window is open and said power line frequency is below said threshold; and
tripping said circuit interrupter if a third pattern of pulse signals occur when said window is open and said power line frequency is above said threshold.

23. A method according to claim 22, further comprising the step of disabling detection of said pulse signals if a magnitude of said line frequency component is below a threshold current.

24. A method according to claim 23, wherein said threshold current is 5 amperes.

25. A method according to claim 22, further comprising the step of ignoring said pulse signals while said window is open if there is a presence of pulse signals for a predetermined interval.

26. A method according to claim 25, wherein said predetermined interval is a half cycle of the power line frequency.

27. A method according to claim 22, further comprising the step of preventing tripping of a circuit interrupter if said pulse signals continue without interruption for a predetermined interval.

28. A method according to claim 27, wherein said interval is one half cycle of the power line frequency.

29. A method according to claim 22, further comprising the step of producing a trip signal if one of said line frequency components is above a threshold irrespective of said high frequency components.

30. A method according to claim 29, wherein said threshold is 500 amperes.

31. A method according to claim 22, further comprising the step of amplifying said high frequency component using a voltage doubler circuit, said step of amplifying occurring after the step of sensing and before the step of producing.

32. An apparatus for detecting and interrupting arc faults in electric power lines, comprising:
means for sensing random high frequency components in a load current of said electric power lines;
means for producing pulse signals whose widths correspond to durations of said high frequency components;
means for opening a window upon detection of a first pattern of said pulse signals;
means for ignoring said pulse signals after said window is opened for a first predetermined interval; and
means for interrupting load power in said electric power lines when one of said first pattern of pulse signals and a second pattern of pulse signals occurs after said step of ignoring while said window remains open.

33. An apparatus according to claim 32, further comprising means for determining a phase angle of each trailing portion initiation of an arc fault using a zero cross detector.

34. An apparatus according to claim 32, further comprising means for determining patterns of pulse signals with respect to half cycles of the power line frequency.

35. An apparatus according to claim 34, further comprising means for using a zero cross detector to determine the position of said half cycles.

36. An apparatus according to claim 32, further comprising means for disabling detection of said pulse signals if a magnitude of said line frequency component is below a threshold current.

37. An apparatus according to claim 36, wherein said threshold current is 5 amperes.

38. An apparatus according to claim 32, further comprising means for ignoring said pulse signals while said window is open if there is a presence of pulse signals for a second predetermined interval.

39. An apparatus according to claim 38, wherein said second predetermined interval is a half cycle of the power line frequency.

40. An apparatus according to claim 32, further comprising means for preventing tripping of a circuit interrupter if said pulse signals continue without interruption for a second predetermined interval.

41. An apparatus according to claim 40, wherein said second predetermined interval is one half cycle of the power line frequency.

42. An apparatus according to claim 32, further comprising means for producing a trip signal if one of said line frequency components is above a threshold irrespective of said high frequency components.

43. An apparatus according to claim 42, wherein said threshold is 500 amperes.

44. An apparatus according to claim 32, further comprising means for amplifying said sensed high frequency component using a voltage doubler circuit before said pulse signals are produced.

45. An apparatus for detecting and interrupting arc faults in electric power lines, comprising:

means for sensing line frequency components and random high frequency components in a load current of said electric power lines;

means for producing pulse signals whose widths correspond to durations of said high frequency components;

means for opening a window upon detection of at least one predetermined first pattern of pulse signals;

means for comparing a magnitude of a power line frequency against a threshold;

means for tripping a circuit interrupter on said electric power lines if a second pattern of pulse signals occurs when said window is open and said power line frequency is below said threshold; and means for tripping said circuit interrupter if a third pattern of pulse signals occur when said window is open and said power line frequency is above said threshold.

46. A method according to claim 11, further comprising the step of disabling detection of said pulse signals if a magnitude of said line frequency component is below a threshold current.

47. A method according to claim 46, wherein said threshold current is 5 amperes.

48. An apparatus according to claim 45, further comprising means for disabling detection of said pulse signals if a magnitude of said line frequency component is below a threshold current.

49. An apparatus according to claim 48, wherein said threshold current is 5 amperes.

50. An apparatus according to claim 45, further comprising means for ignoring said pulse signals while said window is open if there is a presence of pulse signals for a predetermined interval.

51. An apparatus according to claim 50, wherein said predetermined interval is a half cycle of the power line frequency.

52. An apparatus according to claim 45, further comprising means for preventing tripping of a circuit interrupter if said pulse signals continue without interruption for a predetermined interval.

53. An apparatus according to claim 52, wherein said predetermined interval is one half cycle of the power line frequency.

54. An apparatus according to claim 45, further comprising means for producing a trip signal if one of said line frequency components is above a threshold irrespective of said high frequency components.

55. An apparatus according to claim 54, wherein said threshold is 500 amperes.

56. An apparatus according to claim 45, further comprising means for amplifying said sensed high frequency component using a voltage doubler circuit before said pulse signals are produced.

* * * * *